(12) United States Patent
Owada

(10) Patent No.: US 9,869,927 B2
(45) Date of Patent: Jan. 16, 2018

(54) WAVELENGTH CONVERTING MODULE AND SEMICONDUCTOR LIGHT-EMITTING APPARATUS USING THE SAME

(71) Applicant: Stanley Electric Co., Ltd., Tokyo (JP)

(72) Inventor: Soji Owada, Tokyo (JP)

(73) Assignee: Stanley Electric Co., Ltd, Tokyo (JP)

( * ) Notice: Subject to any disclaimer, the term of this patent is extended or adjusted under 35 U.S.C. 154(b) by 64 days.

(21) Appl. No.: 15/163,507

(22) Filed: May 24, 2016

(65) Prior Publication Data

US 2016/0348856 A1 Dec. 1, 2016

(30) Foreign Application Priority Data

May 25, 2015 (JP) ................. 2015-105883

(51) Int. Cl.
| | |
|---|---|
| *F21V 9/16* | (2006.01) |
| *G03B 21/20* | (2006.01) |
| *F21S 8/10* | (2006.01) |
| *F21V 13/12* | (2006.01) |
| *F21K 9/64* | (2016.01) |
| *C09K 11/77* | (2006.01) |
| *H01L 33/50* | (2010.01) |
| *F21V 14/04* | (2006.01) |

(Continued)

(52) U.S. Cl.
CPC ...... *G03B 21/2066* (2013.01); *C09K 11/7734* (2013.01); *C09K 11/7773* (2013.01); *C09K 11/7792* (2013.01); *F21K 9/64* (2016.08); *F21S 48/00* (2013.01); *F21S 48/12* (2013.01); *F21V 9/16* (2013.01); *F21V 13/12* (2013.01); *G03B 21/204* (2013.01); *H01L 33/50* (2013.01); *F21V 14/04* (2013.01); *F21W 2131/103* (2013.01); *F21W 2131/406* (2013.01); *F21Y 2115/10* (2016.08); *F21Y 2115/30* (2016.08)

(58) Field of Classification Search
USPC ........... 362/84, 217.02, 217.05, 217.08, 235, 362/249.02, 341
See application file for complete search history.

(56) References Cited

U.S. PATENT DOCUMENTS

| | | | |
|---|---|---|---|
| 8,556,437 | B2 | 10/2013 | Miyake |
| 8,956,025 | B2 | 2/2015 | Kushimoto |

(Continued)

FOREIGN PATENT DOCUMENTS

| | | |
|---|---|---|
| JP | 2012-64484 A | 3/2012 |
| JP | 2013-102078 A | 5/2013 |

*Primary Examiner* — Vip Patel
(74) *Attorney, Agent, or Firm* — Kenealy Vaidya LLP

(57) ABSTRACT

A wavelength converting module and a semiconductor light-emitting apparatus using the wavelength converting module can emit various color lights. The light-emitting apparatus can include a semiconductor light source emitting an exciting light and an optical reflector, which reflects the exciting light toward the wavelength converting module. The wavelength converting module can include a base board and a cavity formed by a divider located on the base board. The exciting light can enter into the cavity including a phosphor layer contained in the wavelength converting module and can emit a mixture light using the phosphor layer in only one cavity. Thus, the semiconductor light-emitting apparatus using the wavelength converting module can emit various color lights having a high light-intensity and a substantially uniform color tone in order to be able to be used for vehicle lamp such as a headlight, general lighting, a stage light, a street light, a projector, etc.

20 Claims, 14 Drawing Sheets

(51) Int. Cl.
    *F21W 131/103*     (2006.01)
    *F21W 131/406*     (2006.01)
    *F21Y 115/30*     (2016.01)
    *F21Y 115/10*     (2016.01)

(56) References Cited

U.S. PATENT DOCUMENTS

| | | |
|---|---|---|
| 2015/0175054 A1 | 6/2015 | Yatsuda et al. |
| 2015/0372200 A1 | 12/2015 | Seko et al. |
| 2016/0131314 A1 | 5/2016 | Waragaya |
| 2016/0138766 A1 | 5/2016 | Owada |

FIG. 5a Exemplary embodiment
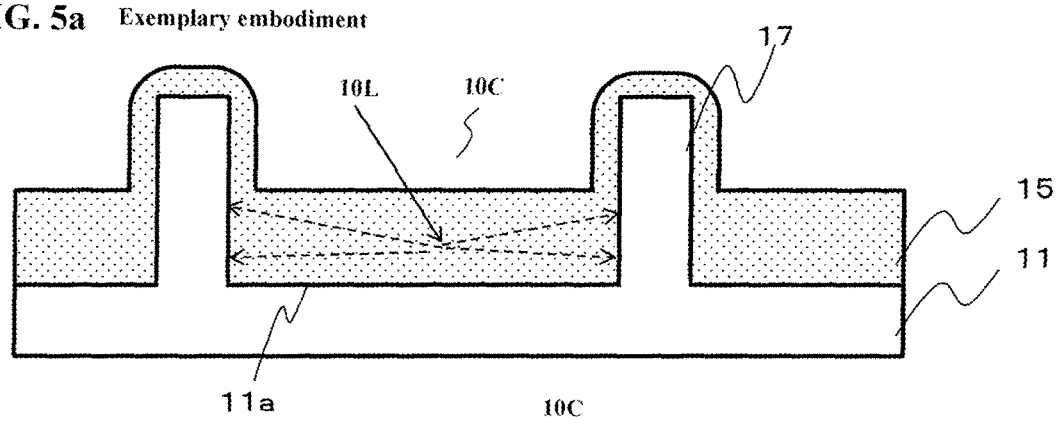
FIG. 5b Comparative embodiment
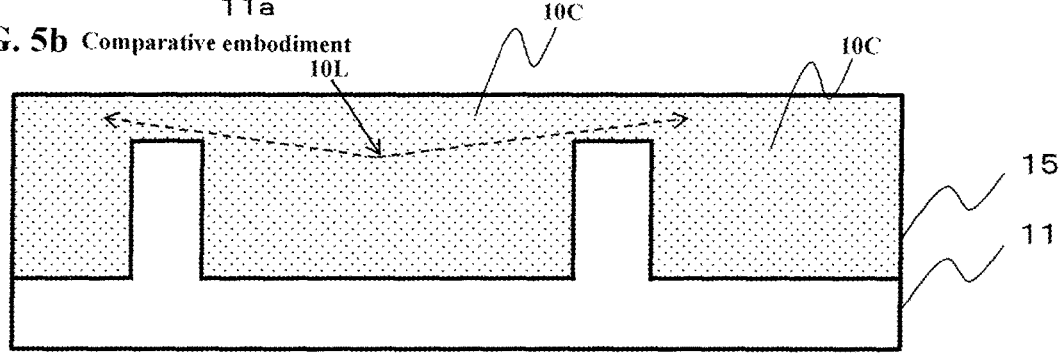

WAVELENGTH CONVERTING MODULE AND SEMICONDUCTOR LIGHT-EMITTING APPARATUS USING THE SAME

This application claims the priority benefit under 35 U.S.C. §119 of Japanese Patent Application No. 2015-105883 filed on May 25, 2015, which is hereby incorporated in its entirety by reference.

BACKGROUND

1. Field

The presently disclosed subject matter relates to reflective typed wavelength converting modules and semiconductor light-emitting apparatuses using the wavelength converting module, and more particularly to the reflective typed wavelength converting modules, which can emit mixture lights having substantially various uniform color tones and a high light-intensity using an exciting light emitted from a semiconductor light source and the semiconductor light-emitting apparatuses using the wavelength converting module, which can emit various color lights having a high light-intensity and a substantially uniform color tone including a substantially white light in order to be able to be used for vehicle lamp such as a headlight, general lighting, a stage light, a street light, a projector, etc.

2. Description of the Related Art

A range of application for semiconductor light-emitting apparatuses, which may emit various color lights by combining a wavelength converting material such as a phosphor layer with a semiconductor light-emitting device such as an LED, have expanded to various fields such as vehicle lamps, general lighting, street lighting and the like, because brightness of the semiconductor light-emitting apparatuses have improved. As a type of such the light-emitting apparatuses, a transmission type, which emits a mixture light having a color tone from a light-emitting surface of the phosphor layer by entering an exciting light into the phosphor layer from an incident surface located on opposite side of the light-emitting surface, is well known.

As another type, a reflective type, which emits a mixture light having a color tone from a light-emitting surface of a phosphor plate including a reflector surface by entering an exciting light into the phosphor plate from an incident surface located on the same reflector surface and by reflecting the mixture light with the reflector surface, is well known. The reflective type may emit the mixture light having a high light-intensity mainly by using the mixture light reflected from the reflector surface, and therefore has been expected to expand in application.

FIG. 13 is a schematic structural view showing a conventional semiconductor light source apparatus of the reflective type disclosed in Patent document No. 1 (Japanese Patent Application Laid Open JP2012-64484), and another conventional light source apparatus similar to the conventional semiconductor light source apparatus is also disclosed Patent document No. 2 (U.S. Pat. No. 8,556,437). The patent documents No. 1 and No. 2 are disclosed by a same inventor, and are owned by Applicant of this disclosed subject matter.

The conventional semiconductor light source apparatus includes: a reflector 84; a phosphor ceramic 83 arranged on the reflector 84 via a transparent adhesive material 85; a semiconductor light-emitting device 81 having an optical axis 82 located adjacent the phosphor ceramic 83, the optical axis 82 intersecting with the phosphor ceramic 83; a mixture light 86 having a color tone emitted from a light-emitting surface of the phosphor ceramic 83 by entering an exciting light emitted from the semiconductor light-emitting device 81 into the phosphor ceramic 83 and by reflecting the mixture light using at least one of the reflector 84, the transparent adhesive material 85 and the phosphor ceramic 83; and an optical lens 87 located in a direction of the light-emitting surface of the phosphor ceramic 83, and projecting a prescribed light distribution pattern using the mixture light 86.

In the conventional semiconductor light source apparatus 80, a heat generated from the phosphor ceramic 83 by the exciting light emitted from the semiconductor light-emitting device 81 may mainly radiate from the reflector 84, which is made from a metallic plate, and therefore may not degrade the phosphor ceramic 83. However, because the heat generated from the phosphor ceramic 83 may degrade the transparent adhesive material 85, an adhesive intensity between the phosphor ceramic 83 and the reflector 84 may degrade and a reflectivity of the reflector 84 may decrease. Hence, the heat generated from the phosphor ceramic 83 may cause optical characteristics of the semiconductor light source apparatus 80 to gradually deteriorate.

Accordingly, even when a high power semiconductor light source is used under a large current as a light source, reflective type semiconductor light source apparatuses that can emit various color lights having high brightness and can efficiently radiate a heat, is disclosed in Patent document No. 3 (U.S. patent application Ser. No. 14/943,240) by the inventor of this disclosed subject matter. By contrast with reflective type light source apparatuses, transmission type semiconductor light source apparatus are also disclosed by the inventor of this disclosed subject matter.

A conventional transmission type semiconductor light-emitting apparatus that may prevent a color variation, is disclosed in Patent document No. 4 (Japanese Patent Application Laid Open JP2013-102078) by the inventor of this disclosed subject matter, and which is owned by Applicant of this disclosed subject matter. FIG. 14 is a schematic explanatory perspective view showing the conventional transmission type semiconductor light-emitting apparatus disclosed in Patent document No. 4. The conventional semiconductor light-emitting apparatus 90 includes: a semiconductor light source 95 having a light beam diameter 95D, and a wavelength converting plate 92 including a plurality of wavelength converting chips 97 and a plurality of plates 96, which divides the wavelength converting plate 92 into the plurality of wavelength converting chips 97.

In the conventional semiconductor light-emitting apparatus 90, a diameter 95D of the light beam emitted from the semiconductor light source 95 becomes smaller than each of widths in directions of X-direction and Y-direction of each of the wavelength converting chips 97 so that the light beam emitted from the semiconductor light source 95 can enter into each of incident surfaces of the wavelength converting chips 97. Additionally, the plurality of plates 96 are made from a metallic plate having a high reflectivity such as a silver, aluminum and the like so that the light beam entering into each of the incident surfaces of the wavelength converting chips 97 may be emitted from a respective one of light-emitting surfaces of the wavelength converting chips 97. Thereby, the conventional semiconductor light-emitting apparatus 90 may prevent the color variation such as a yellow ring even when each of the wavelength converting chips 97 include a yellow phosphor.

Recently, vehicle headlights using a semiconductor light source and a mirror that can provide various light distribution patterns for drivers and headlight systems using the headlights that can vary a light distribution pattern so that the drivers can drive a motor vehicle safely in accordance with surroundings such as an oncoming vehicle, a forward travelling vehicle, a road and the like have been developed. Such a headlight system is disclosed, for example, in Patent document No. 5, which is owned by Applicant of this disclosed subject matter.

When the vehicle headlights use a semiconductor light source and a mirror to provide various light distribution patterns for the drivers, light emitted from the semiconductor light source may scan on the wavelength converting plate 92 including the plurality of wavelength converting chips 97. In this case, a part of the light emitted from the semiconductor light source hits on the plurality of plate 96 and may return toward the semiconductor light source 95. Accordingly, when the vehicle headlights having such a structure, in which the light scans on the wavelength converting plate 92, use the wavelength converting plate 92 including the plurality of wavelength converting chips 97, the vehicle headlights may decrease a light-emitting efficiency thereof.

The above-referenced Patent Documents and additional Patent Documents are listed below and are hereby incorporated with their English abstracts in their entireties.
1. Patent document No. 1: Japanese Patent Application Laid Open JP2012-64484
2. Patent document No. 2: U.S. Pat. No. 8,556,437
3. Patent document No. 3: U.S. patent application Ser. No. 14/943,240
4. Patent document No. 4: Japanese Patent Application Laid Open JP2013-102078
5. Patent document No. 5: U.S. Pat. No. 8,956,025
6. Patent document No. 6: U.S. Patent Publication No. 2015-0372200-A1
7. Patent document No. 7: U.S. patent application Ser. No. 14/937,823
8. Patent document No. 8: U.S. Patent Publication No. 2015-0175054-A1

The disclosed subject matter has been devised to consider the above and other problems, characteristics and features. Thus, an embodiment of the disclosed subject matter can include semiconductor light-emitting apparatuses using a wavelength converting module, which can emit various color lights having a substantially uniform color tone and a high light-intensity and can efficiently radiate a heat, even when a high power semiconductor light source such a laser device is used as a light source. In this case, an exciting light emitted from the laser device can be efficiently wavelength-converted by the wavelength converting module without a reduction of light intensity, because a phosphor layer included in the wavelength converting module is substantially located on a base board having a high radiating-efficiency, and also the wavelength converting module can enable the phosphor layer not to include a substantially resin component.

In addition, the base board can connect a radiating fin in an opposite direction of the phosphor layer as a radiator to further improve a radiating efficiency and permanence of the phosphor layer even when the high power semiconductor light source such as the laser device is used as a light source. Thus, the semiconductor light-emitting apparatuses can also emit the various color lights having the substantially uniform color tone and a high light-intensity via an optical device such as a projector lens, and therefore can be employed for various lighting units such as a vehicle headlight, general lighting, a stage light, a street light, a projector, etc.

SUMMARY

The presently disclosed subject matter has been devised in view of the above and other characteristics, desires, and problems in the conventional art. An aspect of the disclosed subject matter can provide reflective type wavelength converting modules, which can emit mixture lights having substantially various uniform color tones and a high light-intensity using an exciting light emitted from a semiconductor light source while preventing a color variation such as a yellow ring due to a yellow phosphor. Another aspect of the disclosed subject matter can provide the reflective type semiconductor light-emitting apparatuses using the wavelength converting module, which can emit various color lights having a high light-intensity and a substantially uniform color tone including a substantially white color tone in order to be able to be used for vehicle lamp such as a headlight, general lighting, a stage light, a street light, a projector, etc.

According to an aspect of the disclosed subject matter, a wavelength converting module can include: a base board formed in a substantially planar shape; a divider located on a board top surface of the base board, each of a first divider and a second divider thereof intersecting at a substantially right angle with respect each other, a divider side surface thereof located between a divider top surface of the divider and the board top surface of the base board, and the divider top surface of the divider located in a substantially parallel direction with the board top surface of the base board; a cavity formed on the board top surface by surrounding the cavity with the first divider and the second divider, and formed in a substantially rectangular shape as viewed from an opposite direction of the board top surface; and a phosphor layer having a thickness including at least one of a red phosphor, a green phosphor, a blue phosphor and a yellow phosphor, formed on the divider top surface and the board top surface, and wherein the thickness of the phosphor layer is lower than the height of the divider.

In the above-described exemplary wavelength converting module, the base board can include at least one of a metal, an oxide ceramic and a non oxide ceramic to improve a reflectivity and a radiating efficiency, and the divider can be integrated into the base board with a simple structure. The divider top surface can include at least one concave portion toward the board top surface of the base board, and also can narrow from the divider top surface toward the board top surface to easily include the phosphor of the phosphor layer thereon. Additionally, each of the first divider and the second divider can be located in a direction substantially perpendicular to the board top surface, and the phosphor layer can be formed also around the divider side surface continuously between the phosphor layer located on the divider top surface and the phosphor layer located on the board top surface.

According to the above-described exemplary wavelength converting module, the mixture light cannot move in directions of the adjacent cavity even when the mixture light is fully diffused in the phosphor layer of only one cavity, after a laser beam used as the exciting light enters into the phosphor layer. Accordingly, the wavelength converting module of the disclosed subject matter can emit the mixture light having substantially various uniform color tones and a high light-intensity using the exciting light (e.g., a laser beam having a high light-intensity) emitted from the semiconductor light source while preventing the color variation such as the yellow ring due to the yellow phosphor.

According to another aspect of the disclosed subject matter, an exemplary the semiconductor light-emitting apparatus using one of the above-described wavelength converting modules can further include: a semiconductor light source configured to emit an exciting light; an optical reflector configured to receive the exciting light emitted from the semiconductor light source, and configured to reflect the exciting light toward the wavelength converting module; a casing attaching the semiconductor light source, the optical reflector and the wavelength converting module; and wherein the wavelength converting module is configured to receive the exciting light emitted from the semiconductor light source via the optical reflector, configured to wavelength-convert the exciting light into light having a longer light-emitting wavelength than that of the exciting, and is configured to emit the mixture light toward an opening of the casing.

According to the above-described exemplary semiconductor light-emitting apparatuses, the above-described wavelength converting module can emit the mixture light having substantially various uniform color tones and a high light-intensity using the exciting light emitted from the semiconductor light source while preventing the color variation. Thus, the disclosed subject matter can provide the reflective type semiconductor light-emitting apparatuses using the wavelength converting module, which can emit various color lights having a high light-intensity and a substantially uniform color tone including a substantially white color tone in order to be able to be used for vehicle lamp such as a headlight, general lighting, a stage light, a street light, a projector, etc.

BRIEF DESCRIPTION OF THE DRAWINGS

These and other characteristics and features of the disclosed subject matter will become clear from the following description with reference to the accompanying drawings, wherein:

FIG. 3b is a partial cross-sectional side view taken along line A-A shown in FIG. 3a of the wavelength converting module of FIG. 3a;

FIGS. 5a and 5b are enlarged explanatory cross-sectional views depicting exemplary light paths in the first embodiment and in a comparative embodiment of the wavelength converting module shown in FIGS. 3a and 3b, respectively;

FIG. 10b is an explanatory partial enlarged cross-sectional side view showing only one divider of the third exemplary embodiment of the wavelength converting module shown in FIG. 10a;

FIG. 11b is an explanatory partial enlarged cross-sectional side view showing an exemplary variation of the third exemplary embodiment of the wavelength converting module shown in FIG. 11a;

FIG. 12 is an explanatory partial enlarged cross-sectional side view showing another exemplary variation of the third exemplary embodiments of the wavelength converting module shown in FIG. 11a;

DETAILED DESCRIPTION OF EXEMPLARY EMBODIMENTS

Figure 1A:
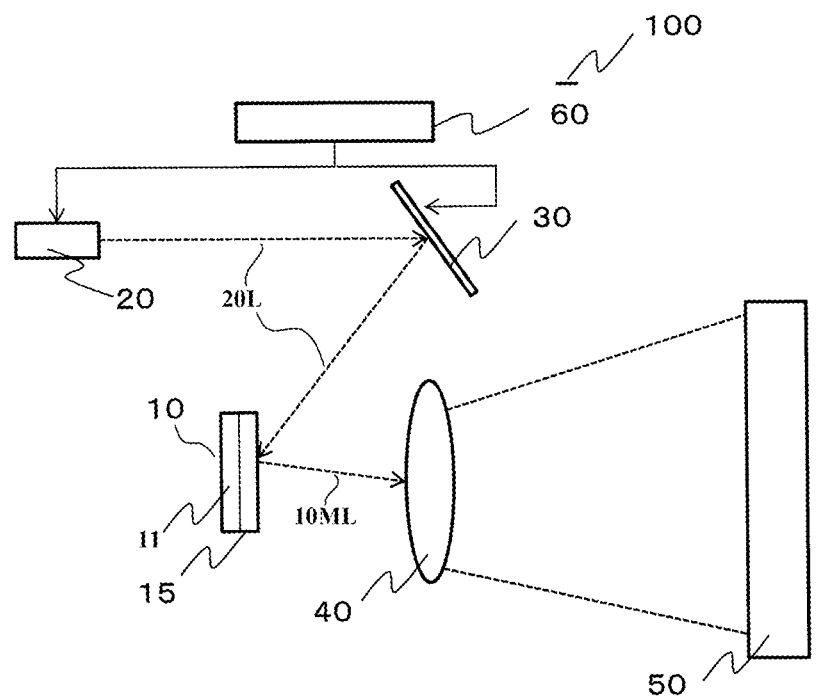
FIG. 1a is an explanatory structural view showing an exemplary embodiment of a semiconductor light-emitting apparatus using a wavelength converting module made in accordance with principles of the disclosed subject matter.

The disclosed subject matter will now be described in detail with reference to FIGS. 1a to 12, in which the same or corresponding elements use the same reference marks. FIG. 1 is an explanatory structural view showing an exemplary embodiment of a semiconductor light-emitting apparatus using a wavelength converting module made in accordance with principles of the disclosed subject matter, and FIGS. 1b and 1c are schematic cross-sectional views showing the exemplary embodiment and an exemplary variation of the embodiment of the semiconductor light-emitting apparatus made in accordance with the principles of the disclosed subject matter, respectively.

A semiconductor light-emitting apparatus 100 can include: a semiconductor light source 20 configured to emit an exciting light 20L; a wavelength converting module 10 including a base board 11 and a phosphor layer 15 configured to receive the exciting light 20L emitted from the semiconductor light source 20, configured to wavelength-convert the exciting light 20L into light having a longer light-emitting wavelength than that of the exciting light 20L emitted from the semiconductor light source 20, and configured to emit a mixture light 10ML, which mixes a part of the exciting light 20L with the light having the longer light-emitting wavelength than that of the exciting light 20L; and an optical reflector 30 configured to reflect the exciting light 20L emitted from the semiconductor light source 20 toward the wavelength converting module 10 so that the phosphor layer 15 of the wavelength converting module 10 can receive the exciting light 20L.

In addition, the semiconductor light-emitting apparatus 100 can also include; an projector lens 40 configured to project the mixture light 10ML emitted from the wavelength converting module 10 toward a projecting object 50; and a controller 60 configured to control the semiconductor light source 20 and the optical reflector 30 so that the phosphor layer 15 of the wavelength converting module 10 can receive the exciting light 20L via the optical reflector 30 and so that the projector lens 40 can project the mixture light 10ML toward the projecting object 50.

Figure 1B:
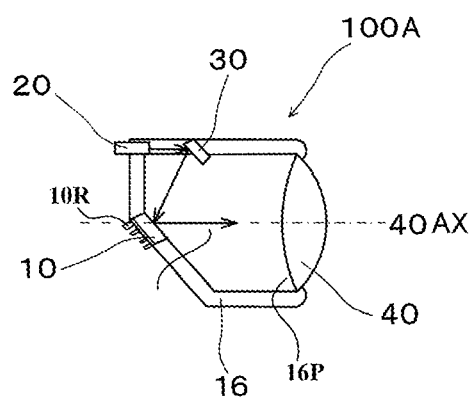
FIGS. 1b and 1c are schematic cross-sectional views showing the exemplary embodiment and an exemplary variation of the embodiment of the semiconductor light-emitting apparatus made in accordance with the principles of the disclosed subject matter, respectively.
Figure 1C:
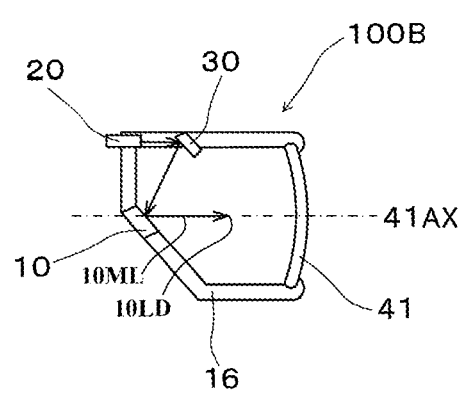

A semiconductor light-emitting apparatus 100A can include a casing 16 having an opening 16P attaching the semiconductor light source 20, the optical reflector 30 and the wavelength converting module 10 having a light-emitting direction 10LD of the mixture light 10ML and the projector lens 40 having an optical axis 40AX, which corresponds to substantially the light-emitting direction 10LD of the mixture light 10ML, and which is attached to the opening 16P as shown in FIG. 1b. In a semiconductor light-emitting apparatus 100B having a lens light-emitting direction 41AX as shown in FIG. 1c, the above-described projector lens 40 can be replaced with an outer lens 41, and the light-emitting direction 10LD of the mixture light 10ML can correspond to substantially the lens light-emitting direction 41AX.

In these cases, when an amount of heat generated from the wavelength converting module 10 is large, a heat sink 10R can be attached to the base board 11 of the wavelength converting module 10 in an outward direction of the apparatus 100A as shown in FIG. 1b. Thereby, the semiconductor light-emitting apparatus 100A can radiate the heat generated from the wavelength converting module 10 even when the semiconductor light source 20 includes a laser device having a high power.

Therefore, the semiconductor light-emitting apparatus 100A can be used as a light-emitting apparatus for a vehicle headlight as described later with reference to FIG. 2. The semiconductor light-emitting apparatus 100B shown in FIG. 1c can also be used as a light-emitting apparatus for vehicle lamps such as a headlight, a tail lamp, etc.

As the semiconductor light source 20, a semiconductor laser device of a can type disclosed in Patent document No. 6 (U.S. Patent Publication No. 2015-0372200-A1) can be used, and also a semiconductor laser device including a laser chip disclosed in Patent document No. 7 (U.S. patent application Ser. No. 14/937,823). The above Patent documents No. 6 and No. 7 are owned by Applicant of this disclosed subject matter. The semiconductor light source 20 can include an LED of GaN series that emits blue light having a light-emitting wavelength of approximately 450 nanometers, and also include a laser diode having a light-emitting wavelength of approximately 450 nanometers and a light-emitting intensity of several watts to several hundred watts that emits blue light.

In addition, the semiconductor light source 20 can also include an LED of InGaN series that emits near-ultraviolet light having a light-emitting wavelength of approximately 380 nanometers, and can include a laser diode that emits ultraviolet light, which is used as an exciting light for the wavelength converting module 10.

The phosphor layer 15 of the wavelength converting module 10 can include at least one phosphor of a red phosphor, a green phosphor, a blue phosphor and a yellow phosphor as disclosed in Patent documents No. 6. Accordingly, the semiconductor light source apparatuses 100, 100A and 100B can emit the mixture light 10ML having various color tones including a substantially white color tone by reflecting the mixture light 10ML in the wavelength converting module 10 due to an additive color mixture using lights excited by at least one phosphor of the red phosphor, the green phosphor, the blue phosphor and the yellow phosphor by using the laser beam emitted from the semiconductor light-emitting device 20 as the exciting light 20L.

Figure 13:
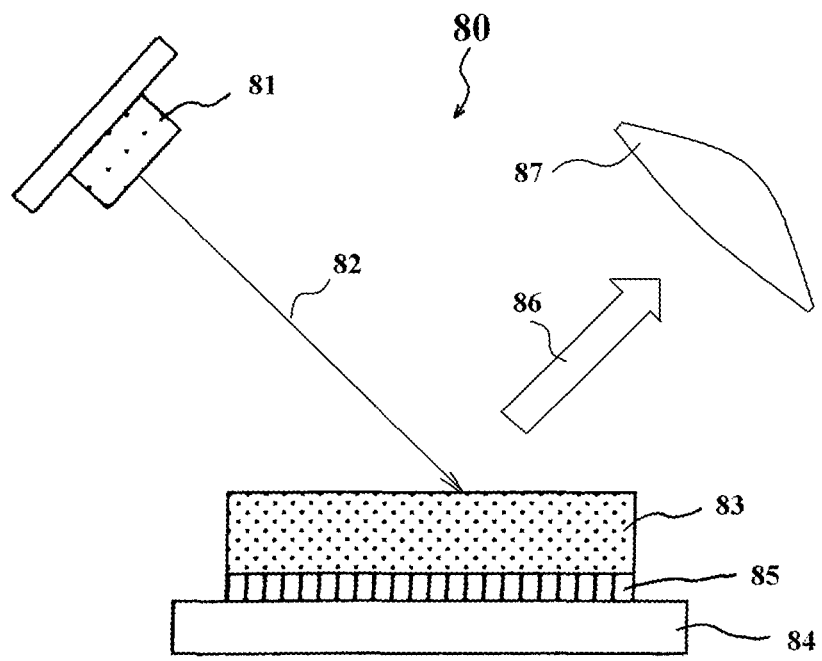
FIG. 13 is a schematic structural view showing a conventional semiconductor light source apparatus of a reflective type.
Figure 14:
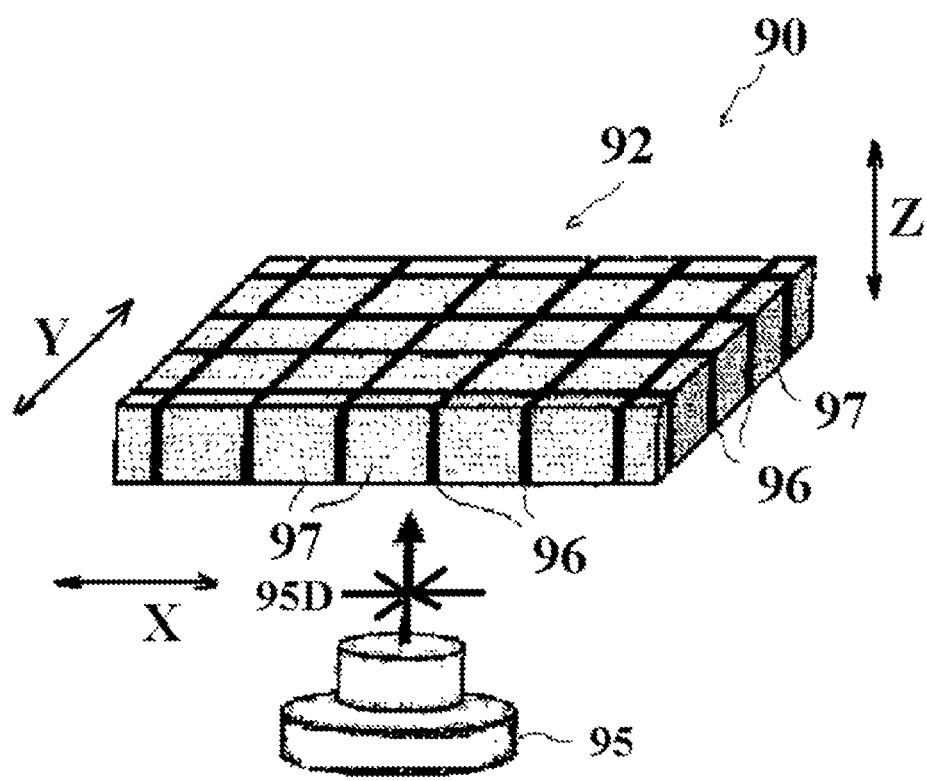
FIG. 14 is a schematic explanatory perspective view showing a conventional transmission type semiconductor light-emitting apparatus.

In this case, the semiconductor light-emitting apparatus 100 can include the conventional structure as shown in FIG. 13. The semiconductor light-emitting apparatus 100A can also be accomplished with a simple structure using a static reflector as the optical reflector 30 by attaching the wavelength converting module 10, the semiconductor light-emitting device 20, the optical reflector 30 and the projector lens to the casing 16, as shown in FIG. 1b. Thereby, the mixture light 10ML emitted from the wavelength converting module 10 can be directed in a direction toward the lens optical axis 40AX of the projector lens 40, and therefore can be formed in a desirable light distribution shape via the projector lens 40. Accordingly, the semiconductor light-emitting apparatus 100A can provide favorable light distribution having the various color tones via the projector lens 40.

Moreover, as the optical reflector 30, a micro electro mechanical systems (MEMS) mirror disclosed in Patent document No. 8, which is owned by Applicant of this disclosed subject matter, can be employed. The MEMS mirror can move in two-dimensional directions, and therefore can scan the laser beam emitted from the semiconductor light-emitting device 20 in the two-dimensional directions toward the wavelength converting module 10. In this case, the projector lens 40 can be replaced with an outer lens 41 having a substantially same thickness, as shown FIG. 1c. Therefore, the semiconductor light-emitting apparatus 100B may be lighter than the semiconductor light-emitting apparatus 100A including the projector lens 40 when comparing each weight of the semiconductor light-emitting apparatuses 100A and 100B.

Figure 2:
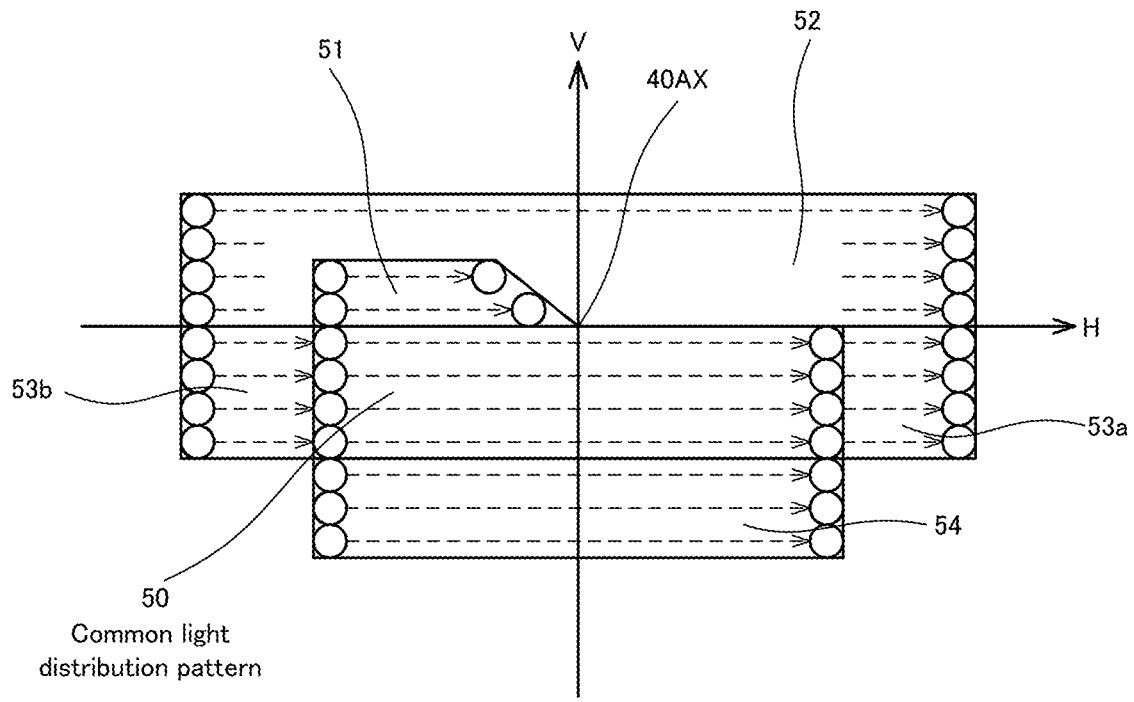
FIG. 2 is an explanatory front view depicting exemplary light distribution patterns formed by the semiconductor light-emitting apparatuses using a micro electro mechanical systems (MEMS) mirror as an optical reflector shown in FIGS. 1b and 1c.

FIG. 2 is an explanatory front view depicting exemplary light distribution patterns formed by the semiconductor light-emitting apparatuses using the MEMS mirror as the optical reflector shown in FIGS. 1b and 1c. When each of the semiconductor light-emitting apparatuses 100A and 100B is used for vehicle headlight, each of the semiconductor light-emitting apparatuses 100A and 100B can various light distribution patterns. Each of the semiconductor light-emitting apparatuses 100A and 100B can provide a low beam light distribution pattern including a common light distribution pattern 50 located under a horizontal line H and an elbow light distribution pattern 51 in a driving direction of a subject vehicle with respect to a vertical line V to improve a forward visibility and not to emitting a glare type light to oncoming vehicles.

In addition, each of the semiconductor light-emitting apparatuses 100A and 100B can provide a high beam light distribution pattern including the common light distribution pattern 50 and an upward light distribution pattern 52 located over the horizontal line H to further improve a forward visibility even when doing a high-speed driving. In these cases, each of the semiconductor light-emitting apparatuses 100A and 100B can also provide a right and left cornering pattern 53a and 53b used when cornering rightward and leftward, respectively, and also can provide a downward light distribution pattern 54 for use during wet weather, etc.

Figure 3A:
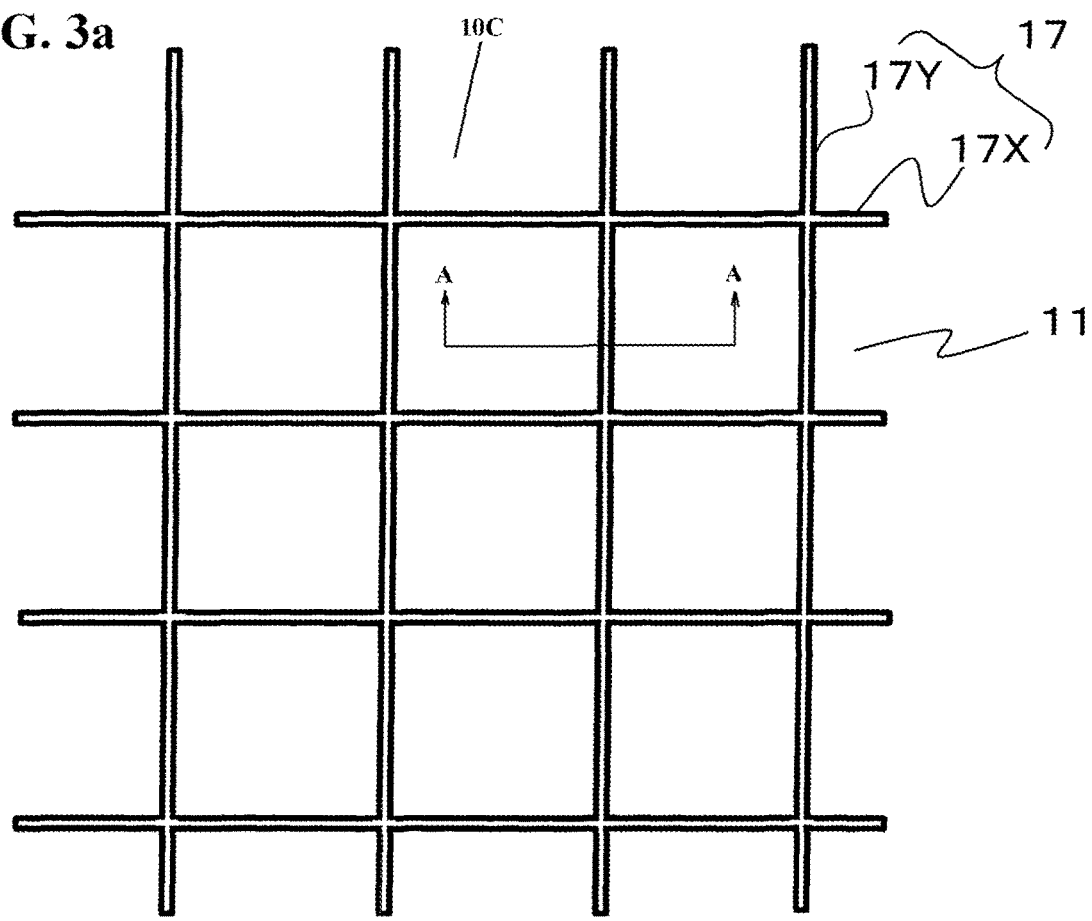
FIG. 3a is a partial top view depicting a first exemplary embodiment of the wavelength converting module included in the semiconductor light-emitting apparatuses shown in FIG. 1a to FIG. 1c.
Figure 3B:
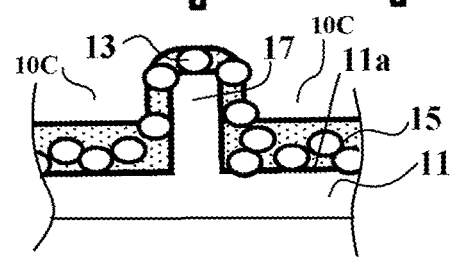
Figure 4:
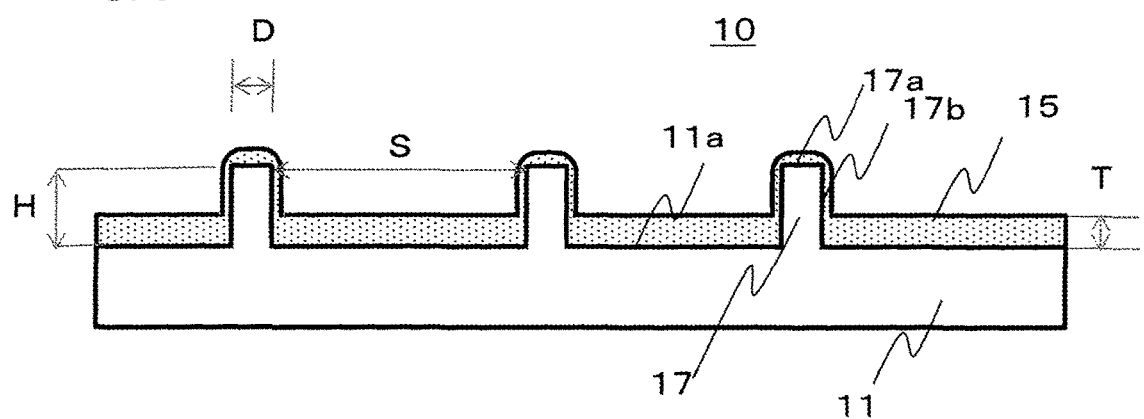
FIG. 4 is an explanatory side view for explain an exemplary size of a divider included in the wavelength converting module shown in FIGS. 3a and 3b.

Next, a first exemplary embodiment of the wavelength converting module 10 will now be described with reference to FIGS. 3a and 3b, wherein FIG. 3a is a partial top view depicting the first exemplary embodiment of the wavelength converting module 10, and FIG. 3b is a partial cross-sectional side view taken along line A-A shown in FIG. 3a of the wavelength converting module 10. The first embodiment of the wavelength converting module 10 can include: the base board 11 having a board top surface 11a formed in a substantially planar shape; a divider 17 having a first divider 17X and a second divider 17Y. which intersect at a substantially right angle with respect to each other, and located substantially perpendicular to the board top surface 11a of the base board 11; the phosphor layer 15 having a phosphor 13 formed continuously on the board top surface 11a of the base board 11 and around the divider 17; and a cavity 10C surrounding the divider 17, and sagging in a direction of the board top surface 11a of the base board 11, as shown in FIG. 3b.

The base board 11 can operate as a fixing reflective board to form the phosphor layer 15 and to reflect the mixture light, and also can operate as a radiator, which radiates a heat generated from the phosphor layer 15. Accordingly, a metallic substrate such as aluminum, an oxide ceramic such as an alumina and a non oxide ceramic such as an aluminum nitride can be used as the radiating board because these materials have a high reflectivity, a high thermal conductivity and a high workability. Additionally, the base board 11 can also be made from a metal such as Al, Cu, Ti, Ag, Au, Ni, Mo, W, Fe, Pd and the like and an alloy including at least one of the above-described metallic elements. The base board 11 can also be provided with the heat sink 10R on a bottom surface thereof to improve the radiating efficiency as shown in FIG. 1b.

The divider 17 can be formed by etching the base board 11, and thereby can be integrated into the base board. The divider 17 can also be made from materials for the base board 11 described above, and also can be attached on the board top surface 11a of the base board 11 via an adhesive material. With respect to an exemplary size of the divider 17 as show in FIG. 4, a height H of the divider 17 can be 5 micrometers 50 micrometers, and a cavity width S of the divider 17 can be approximately 20 millimeters.

In addition, A width D of the divider 17 can be 1 micrometer to 20 micrometers, and also can be more than double for a mean particle size of the phosphor 13 contained in the phosphor layer 15 to continuously include the phosphor 13 on a divider top surface 17a and around a divider side surface 17 of the divider 17. A thickness T of the phosphor layer 15 can be lower than the height H of the divider 17 as described below with reference to FIGS. 5a and 5b.

When the thickness T of the phosphor layer 15 can be lower than the height H of the divider 17, the mixture light 10L can adequately be diffused in the phosphor layer 15 formed adjacent one cavity 10C, and therefore can become the mixture light 10L having a substantially uniform color tone as shown in FIG. 5a. When the thickness T of the phosphor layer 15 can be higher than the height H of the divider 17, a part of the mixture light 10L may move from the phosphor layer 15 formed adjacent one cavity 10C toward the adjacent cavities, and therefore the mixture light 10L may not necessarily become the mixture light 10L having a substantially uniform color tone in a comparative embodiment shown in FIG. 5b.

The phosphor layer 15 can include at least one phosphor to wavelength-convert the exciting light emitted from the semiconductor light source 20 into light having a longer light-emitting wavelength than that of the exciting light emitted from the semiconductor light source 20. The phosphor layer 15 may not include a substantial amount of resin component, and may include no resin component at all. Specifically, the substantial amount of the resin component for forming the phosphor layer 15 is, for example, 5 wt percentages or less in the phosphor layer 15.

The phosphor layer 15 can be made by dispersing a phosphor powder in a glass, and also a glass phosphor (e.g., oxynitride series glass phosphor such as Ca—Si—Al—O—N series, Y—Si—Al—O—N series, etc.) that adds a light-emitting ion into a glass including components such as phosphorus oxide ($P_2O_3$), silicon oxide ($SiO_2$), boron oxide ($B_2O_3$), aluminum oxide ($Al_2O_3$), etc. and a phosphor ceramic that is composed of a single crystal phosphor or a poly crystal phosphor can be used as the phosphor layer 15. The phosphor ceramic can be made by forming a phosphor in a predetermined shape and by burning the phosphor. In the case, even when an organic material is used as a binder in a manufacturing process for the phosphor layer 15, because the organic component is burnt in a degreasing process after the forming process, the phosphor ceramic can include only the resin component of 5 wt percentages or less.

As the phosphors (e.g., phosphor particle having a mean particle size of 5 to 30 micro meters), which are dispersing in the glass and are used from the phosphor ceramic, $CaAlSiN_3:Eu^{2+}$, $(Ca, Sr)\ AlSiN_3:\ Eu^{2+}$, $Ca_2Si_5N_8:\ Eu^{2+}$, $(Ca, Sr)_2Si_5N_8:\ Eu^{2+}$, $KSiF_6:\ Mn^{4+}$, $KTiF_6:\ Mn^{4+}$ and the like can be used as a red phosphor of the phosphor plate 10. As a yellow phosphor for the phosphor plate 10, $Y_3Al_5O_{12}:Ce^{3+}$(YAG), $(Sr, Ba)_2SiO_4:\ Eu^{2+}$, $Ca_x(Si, Al)_{12}(O, N)_{16}:\ Eu^{2+}$ and the like can be used. As a green phosphor, $(Si, Al)_6(O, N)_8:\ Eu^{2+}$, $BaMgAl_{10}O_{17}:\ Eu^{2+}Mn^{2+}$, $(Ba, Sr)_2SiO_4:Eu^{2+}$, $Y_3(Ga, Al)_5O_{12}:Ce^{3+}$, $Ca_3Sc_2Si_3O_{12}:Ce^{3+}$, $CaSc_2O_4:Eu^{2+}$, $Ba_3Si_6O_{12}N_2:Eu^{2+}$ and the like can be used, and $(Sr, Ca, Ba, Mg)_{10}(PO_4)_6C_{12}:\ Eu^{2+}$, $BaMgAl_{10}O_{17}:Eu^{2+}$, $LaAl(Si, Al)_6(N, O)_{10}:\ Ce^{3+}$ can be used as the blue phosphor.

In addition, the phosphor layer 15 can include at least one of the above-described phosphors that wave-converts the exciting light emitted from the semiconductor light source 20 into light having a prescribed wavelength. For example, when the phosphor layer 15 includes the red phosphor wavelength-converting ultraviolet light into red light, the green phosphor wavelength-converting the ultraviolet light into green light and the blue phosphor wavelength-converting the ultraviolet light into blue light and when the semiconductor light source 20 emits the ultraviolet light, the semiconductor light-emitting apparatus 100 can emit the mixture light 10L having a substantially white color tone by reflecting the mixture light 10L on the base board 11 of the wavelength converting module 12 due to an additive color mixture using lights excited by the three phosphors.

When the phosphor layer 15 includes the red phosphor wavelength-converting blue light into purple light and the green phosphor wavelength-converting the blue light into blue-green light and when the semiconductor light source 20 emits the blue light, the semiconductor light-emitting apparatuses 100, 100A and 100B can also emit the mixture light 10L having a substantially white color tone by reflecting the mixture light 10L on the base board 11 due to an additive color mixture using lights excited by the two phosphors and a part of the blue light that is not excited by the phosphors.

Moreover, when the phosphor layer 15 includes a yellow phosphor wavelength-converting the blue light into yellow light and when the semiconductor light source 20 emits the blue light, the semiconductor light-emitting apparatus 100 can emit the mixture light 10L having a substantially white light by reflecting the mixture light on the base board 11 due to an additive color mixture using light excited by the yellow phosphor and a part of the blue light that is not excited by the yellow phosphor.

Figure 6:
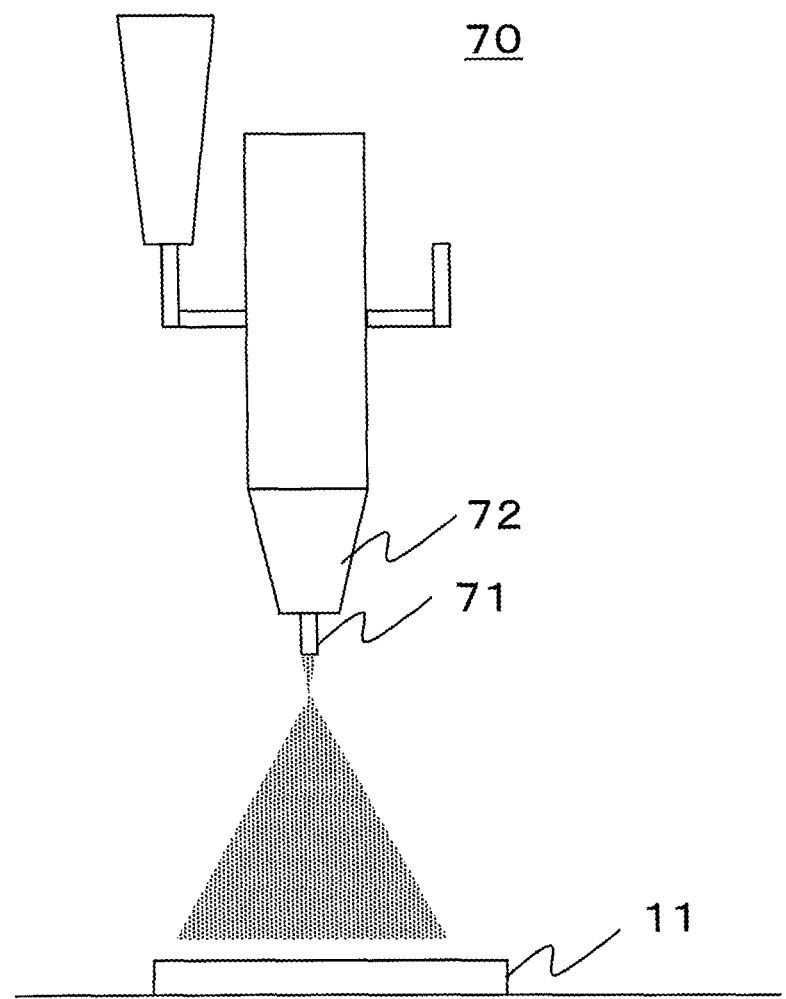
FIG. 6 is a schematic side view showing a spray apparatus to apply a phosphor layer on a board top surface and the like of the wavelength converting module shown in FIGS. 3a and 3b.

When the phosphor layer 15 is formed on the base board 11, a spray apparatus 70 can be used to form the phosphor layer 15 on the base board 11 as shown in FIG. 6. The spray apparatus 70 can include a nozzle 72 for atomizing the above-described phosphor material, and a needle 71 to apply said atomized phosphor material on the base board 11. The atomized phosphor material can be sprayed on the board top surface 11a of the base board 11 and around the divider 17 so as to be formed in a substantially uniform thickness, and the phosphor layer 15 having a substantially uniform thickness (e.g., a thickness of 1 micro meter to 50 micro meters) can be formed by solidifying the atomized phosphor material using a heating treatment at a predetermined temperature.

Figure 7A:
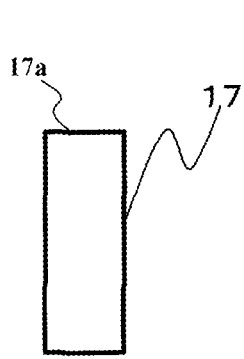
FIG. 7a to FIG. 7d are enlarged side views showing exemplary variations of a divider top surface of the divider included in the wavelength converting module, respectively.
Figure 7B:
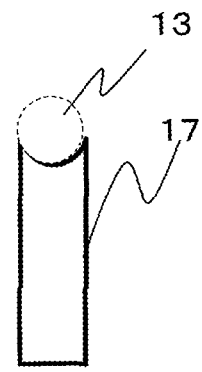
Figure 7C:

Next, exemplary variations of the divider top surface 17a of the divider 17 will now be described with reference to FIG. 7a to FIG. 7d, wherein FIG. 7a shows the divider 17 of the first embodiment of the semiconductor light-emitting apparatus. The divider top surface 17a of the divider 18 can be formed in a concave shape as shown in FIG. 7b, and also can be formed in a V-shape as shown in FIG. 7c. Thereby, the phosphor layer 15 located on the divider top surface 17a of the divider 17 can include the phosphor 13 with confidence by forming the divider top surface 17a of the divider 17 in the concave shape or in the concave V-shape having a shorter width than a diameter of the phosphor, for example, 15 micrometers when the divider top surface 17a is formed in a circular concave shape as shown in FIG. 7b.

Figure 7D:
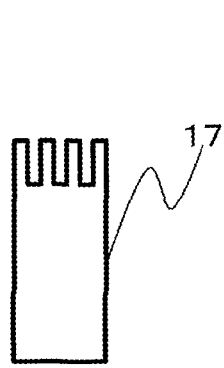

When the divider top surface 17a is formed in the concave V-shape, the divider top surface 17a can become a shorter width than that formed in the circular concave shape (e.g., 10 micro meters). The divider top surface 17a of the divider 17 can include a plurality of cutout sections extending from the divider top surface 17a toward the top surface 11a of the base board 11 as shown in FIG. 7d. Each space of the cutout sections of the divider top surface 17a can maintain the phosphor 13 included in the phosphor layer 15. Accordingly, each of the semiconductor light-emitting apparatuses 100, 100A and 100B including the above-described variations of the divider 11 can also emit the mixture light 10L having a substantially uniform color tone by reflecting the mixture light 10L on the base board 11 and around the divider side surface 17b of the divider 17.

Figure 8:
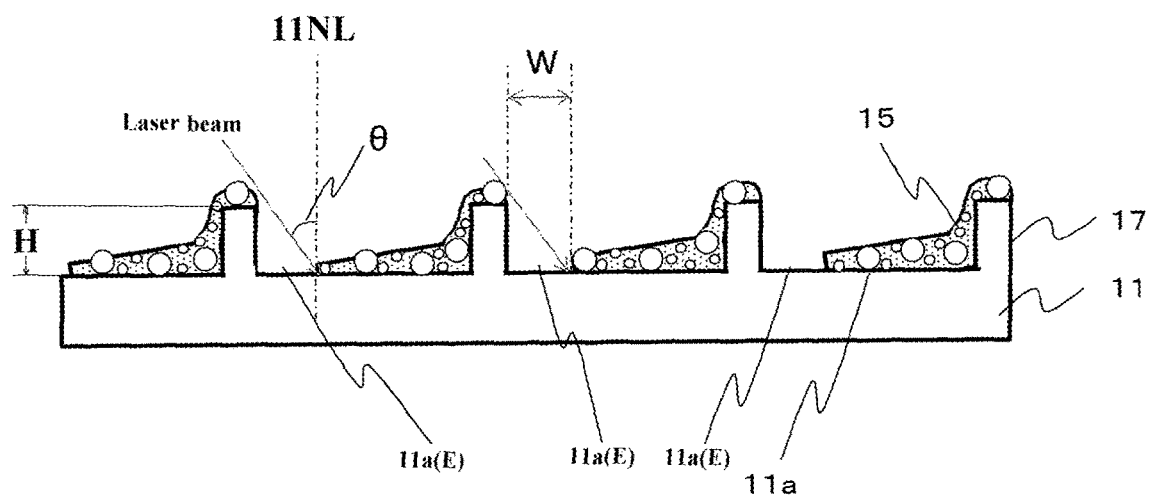
FIG. 8 is an explanatory partial cross-sectional view depicting a second exemplary embodiment of the wavelength converting module included in the semiconductor light-emitting apparatuses shown in FIG. 1a to FIG. 1c FIGS. 9a and 9b are partial top views showing the second exemplary embodiment and an exemplary variation of the second embodiment of the wavelength converting module included in the semiconductor light-emitting apparatus, respectively.

FIG. 8 is an explanatory partial cross-sectional view depicting a second exemplary embodiment of the wavelength converting module included in the semiconductor light-emitting apparatuses. Differences between the exemplary second embodiment and the first embodiment of the wavelength converting module 10 relates to including a part of the board top surface 11a of the base board 11, which is exposed from the phosphor layer 15 in the second embodiment. The laser beam of the exciting light emitted from the semiconductor light source 20 can enter into the phosphor layer 15 at an angle θ with a normal line 11NL of the base board 11.

Figure 9A:
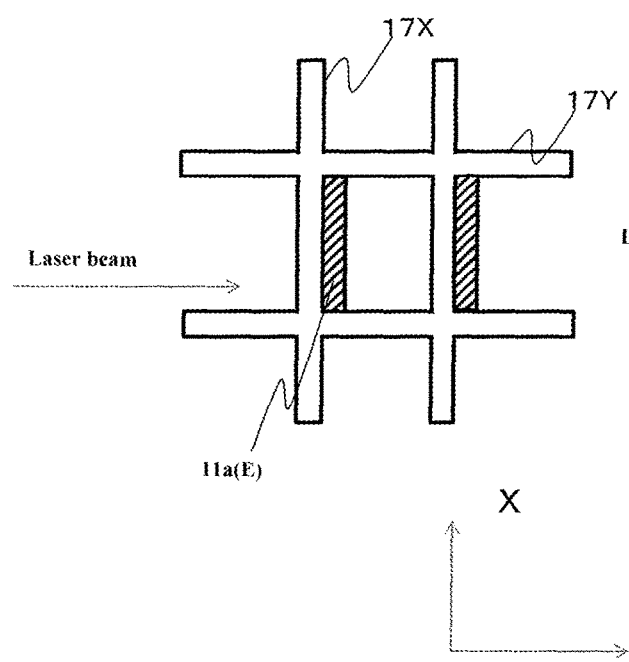

When a width of the board top surface 11a of the base board 11 exposed from the phosphor layer 15 is W, W is H*tan θ. Therefore, the base board 11 can include an exposed top surface 11a (E) having the width W from the phosphor layer 15. As shown in FIG. 9a as a partial top view, when the laser beam is emitted in a direction substantially perpendicular to the first divider 17X (Y direction shown in FIG. 9a), the base board 11 can include the exposed top surface 11a (E) adjacent the first divider 17X. When the laser beam is emitted in a direction substantially perpendicular to the second divider 17Y (X direction shown in FIG. 9a), the base board 11 can include the exposed top surface 11a (E) adjacent the second divider 17Y.

Figure 9B:
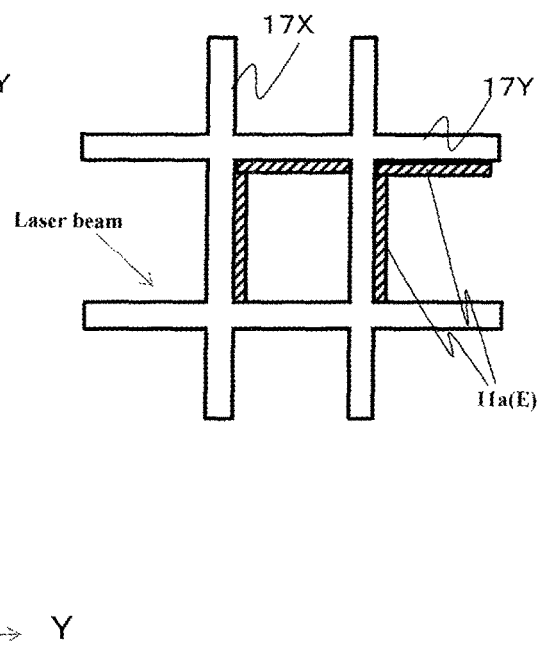

As show in FIG. 9b as an exemplary variation of the second embodiment, when the laser beam is emitted so as to intersect with X direction and Y direction, the base board 11 can include the exposed top surface 11a (E) adjacent both of the first divider 17X and the second divider 17Y continuously. In these cases, when the laser beam as the exciting light is emitted so as not to contact the divider 17 and when the mixture light 10ML is reflected so as not to contact the divider 17, the phosphor layer 15 is not necessarily formed on the divider top surface 17a of the divider 17. Accordingly, each of the semiconductor light-emitting apparatuses 100, 100A and 100B of the second embodiments can emit the mixture light 10L having a substantially uniform color tone by diffusing the mixture light in the phosphor layer 15 of the cavity 10C.

Figure 10A:
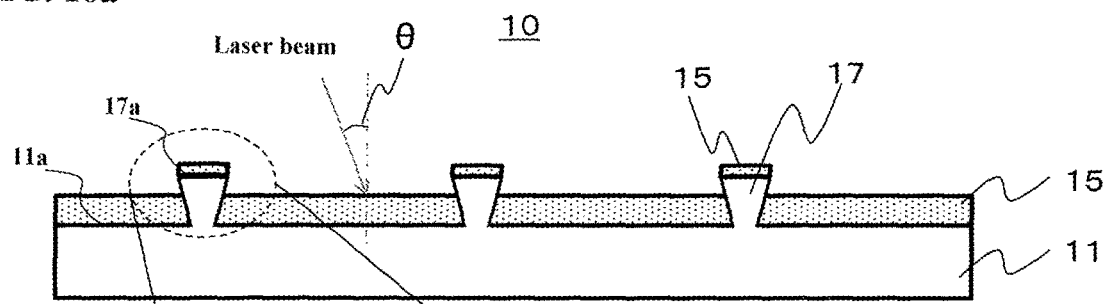
FIG. 10a is an explanatory partial cross-sectional side view showing a third exemplary embodiment of the wavelength converting module included in the semiconductor light-emitting apparatus.
Figure 10B:
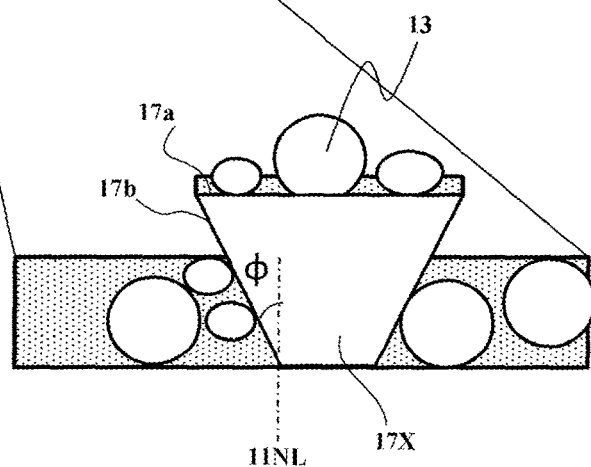

Next, a third exemplary embodiment of the wavelength converting plate will now be described with reference to FIGS. 10a and 10b. Differences between the third exemplary embodiment and the first embodiment of the wavelength converting module 10 relates to a shape of the divider 17. The divider 17 of the third embodiment can narrow from the divider top surface 17a of the divider 17 toward the board top surface 11a of base board 11 at an angle φ with respect to the normal line 11NL. In this case, the phosphor layer 15 is not necessarily need to be formed around the divider side surface 17b of the divider 17 because the laser beam may not contact with the divider side surface 17b when the angle φ is larger than the incident angle θ.

The above-described shape of the divider 17 can be made by an etching process, for example, by controlling etching condition from the board top surface 11a of the base board 11 toward the divider top surface 17a of the divider 17 after etching the shape of the divider 17 of the first embodiment. The divider 17 is separately formed in the above-described shape, and the divider 17 having the above-described shape can be by attaching the above divider 17 on the board top surface 11a of the base board 11 via the adhesive material. The phosphor layer 15 can be formed on the divider top surface 17a of the divider 17 and on the board top surface 11a of the base board 11 in the cavity 10C by using the spray apparatus in common with the first embodiment.

According to the third embodiment, after the laser beam as the exciting light enters into the phosphor layer 15, the mixture light 10ML can be diffused in phosphor layer 15 of the cavity 10C, which is divided by the divider 17 having the reverse taper toward the board top surface 17a thereof, and therefore can be emitted from the wavelength converting module 10 as the mixture light 10ML, which becomes various color lights having a substantially uniform color tone including the substantially white color light. As an exemplary variation of the third embodiment, either the first divider 17X or the second divider 17 can be formed in a rectangular cross-sectional shape in common with the first embodiment. Additionally, the third embodiment can also be combined with each of the divider top surfaces 17a of the second embodiments shown in FIG. 7b to FIG. 7d.

Figure 11A:
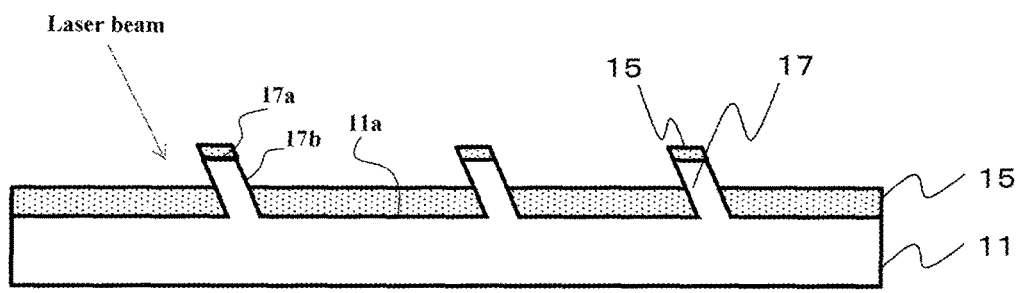
FIG. 11a is an explanatory partial cross-sectional side view showing a fourth exemplary embodiment of the wavelength converting module included in the semiconductor light-emitting apparatus.
Figure 11B:
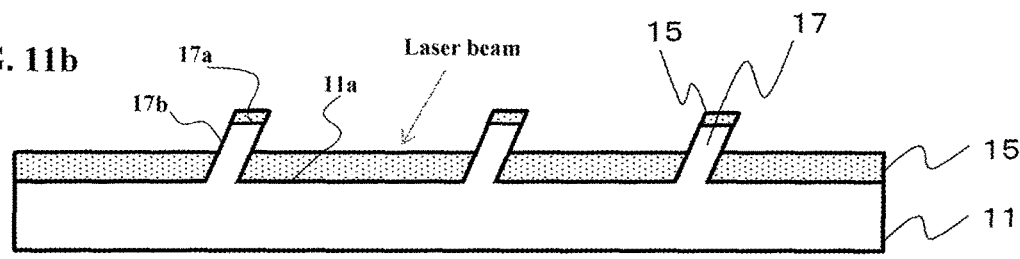

FIG. 11a is an explanatory partial cross-sectional side view showing a fourth exemplary embodiment of the wavelength converting module included in the semiconductor light-emitting apparatus, and FIG. 11b is explanatory partial enlarged cross-sectional side view showing an exemplary variation of the third exemplary embodiment of the wavelength converting plate shown in FIG. 11a. Differences between the fourth exemplary embodiment and the first embodiment of the wavelength converting module 10 relates to including an inclined divider 14 in the fourth embodiment. The divider top surface 17a of the divider 17 can be located in a substantially parallel direction with the top surface 11a of the base board 11.

Figure 12:
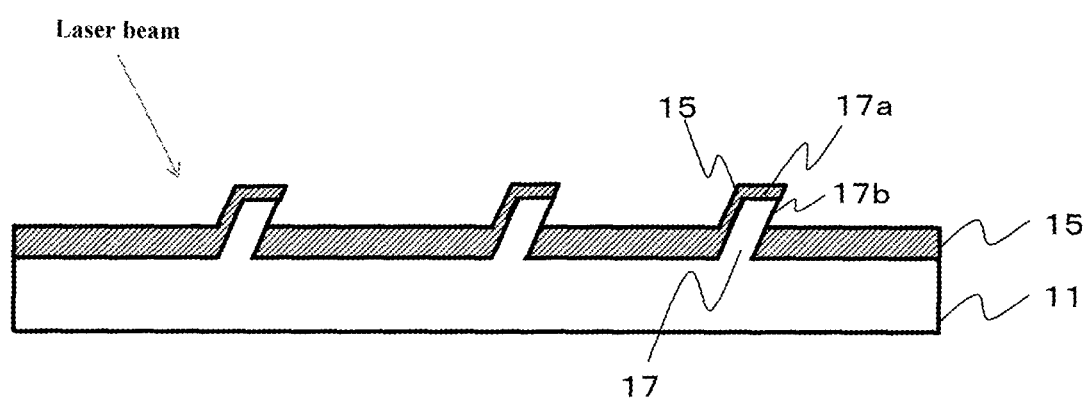

In the fourth embodiments, because the phosphor layer 15 is not necessarily need to be formed around the divider side surface 17b of the divider 17, the mixture light 10ML cannot move in directions of the adjacent cavity 10C after the laser beam enters into the phosphor layer 15. Therefore, each of the semiconductor light-emitting apparatuses 100, 100A and 100B of the fourth embodiments can also emit various color lights having a substantially uniform color tone including the substantially white color light by using the laser beam used as the exciting light emitted from the semiconductor light source 20 after the mixture light 10ML is diffused in the phosphor layer 15 of the cavity 10C. In these cases, on the divider side surface 17b of the divider 17 located in an incident direction of the laser beam, the phosphor layer 15 can also be formed as shown in FIG. 12.

As described above, each of the semiconductor light-emitting apparatuses 100, 100A and 100B can emit the mixture light 10ML having a substantially uniform color tone including the substantially white color light by using the laser beam having a high light-intensity used as the exciting light emitted from the semiconductor light source 20 after the mixture light 10ML is diffused only in the phosphor layer 15 of the cavity 10C. Therefore, the wavelength converting module 10 of the disclosed subject matter can emit the mixture lights 10LM having substantially various uniform color tones and a high light-intensity using the exciting light emitted from the semiconductor light source 20 while preventing the color variation such as the yellow ring due to the yellow phosphor.

Thus, the disclosed subject matter can provide the reflective type semiconductor light-emitting apparatuses using the wavelength converting module, which can emit various color lights having a high light-intensity and a substantially uniform color tone including a substantially white color tone in order to be able to be used for vehicle lamp such as a headlight, general lighting, a stage light, a street light, a projector, etc.

Various modifications of the above disclosed embodiments can be made without departing from the spirit and scope of the presently disclosed subject matter. For example, the semiconductor light-emitting apparatus 100A using the wavelength converting module of FIG. 1b is described as a headlight. However, the semiconductor light-emitting apparatus 100A can be used as general lighting such as a street lighting, etc. In addition, the specific arrangement between components can vary between different applications, and several of the above-described features can be used interchangeably between various embodiments depending on a particular application of the device.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A wavelength converting module, comprising:
    a base board having a board top surface formed in a substantially planar shape;
    a divider having a divider top surface, a divider side surface, a height, a first divider and a second divider located on the board top surface of the base board, each of the first divider and the second divider intersecting at a substantially right angle with respect each other, the divider side surface of the divider located between the divider top surface of the divider and the board top surface of the base board, and the divider top surface of the divider located in a substantially parallel direction with the board top surface of the base board;
    a cavity formed on the board top surface of the base board by surrounding the cavity with the first divider and the second divider, and formed in a substantially rectangular shape as viewed from an opposite direction of the board top surface of the base board; and
    a phosphor layer having a thickness including at least one of a red phosphor, a green phosphor, a blue phosphor and a yellow phosphor, formed on the divider top surface of the divider and the board top surface of the base board, and wherein the thickness of the phosphor layer is lower than the height of the divider.

2. The wavelength converting module according to claim 1, wherein the base board includes at least one of a metal, an oxide ceramic and a non oxide ceramic.

3. The wavelength converting module according to claim 1, wherein the divider is made from a substantially same material as that of the base board.

4. The wavelength converting module according to claim 1, wherein the divider is integrated into the base board.

5. The wavelength converting module according to claim 1, wherein the base board is exposed partially from the phosphor layer located adjacent at least one of the first divider and the second divider.

6. The wavelength converting module according to claim 1, when the divider top surface of the divider includes at least one concave portion toward the board top surface of the base board.

7. The wavelength converting module according to claim 1, wherein each of the first divider and the second divider of the divider is located in a direction substantially perpendicular to the board top surface of the base board, and the phosphor layer is formed also around the divider side surface continuously between the phosphor layer located on the divider top surface of the divider and the phosphor layer located on the board top surface of the base board.

8. The wavelength converting module according to claim 1, wherein the divider top surface of the divider narrows from the divider top surface of the divider toward the board top surface of base board.

9. The wavelength converting module according to claim 1, wherein at least one of the first divider and the second divider of the divider is inclined with respect to the board top surface of the base board in parallel.

10. The wavelength converting module according to claim 9, the phosphor layer is formed also around the divider side surface of the at least one of the first divider and the second divider of the divider, which is inclined at a blunt angle with respect to the board top surface of the base board, continuously between the phosphor layer located on the divider top surface of the divider and the phosphor layer located on the board top surface of the base board.

11. A semiconductor light-emitting apparatus including the wavelength converting module according to claim 1, further comprising:
   a semiconductor light source configured to emit an exciting light;
   an optical reflector configured to receive the exciting light emitted from the semiconductor light source, and configured to reflect the exciting light toward the wavelength converting module;
   a casing having an opening attaching the semiconductor light source, the optical reflector and the wavelength converting module; and
   wherein the wavelength converting module is configured to receive the exciting light emitted from the semiconductor light source via the optical reflector, configured to wavelength-convert the exciting light into light having a longer light-emitting wavelength than that of the exciting, and is configured to emit a mixture light having a light-emitting direction, which mixes a part of the exciting light with the light having the longer light-emitting wavelength than that of the exciting light, toward the opening of the casing.

12. The semiconductor light-emitting apparatus according to claim 11, further comprising:
   a projector lens having an optical axis attached to the opening of the casing, and the optical axis of the projector lens corresponding to substantially the light-emitting direction of the mixture light emitted from the wavelength converting module.

13. The semiconductor light-emitting apparatus according to claim 11, further comprising:
   an outer lens attached to the opening of the casing.

14. The semiconductor light-emitting apparatus according to claim 11, wherein the semiconductor light source includes at least one of a blue light-emitting diode emitting blue light, a ultraviolet light-emitting diode emitting ultraviolet light, a blue laser diode emitting a blue laser beam and a ultraviolet laser diode emitting ultraviolet light.

15. The semiconductor light-emitting apparatus according to claim 11, further comprising:
   a controller configured to control the semiconductor light source to emit the exciting light, and configured to control a movable micro electro mechanical systems (MEMS) mirror used as the optical reflector, wherein the movable MEMS mirror scans the exciting light toward the wavelength converting module in two dimensional directions.

16. A semiconductor light-emitting apparatus including the wavelength converting module according to claim 1, further comprising:
   a semiconductor light source configured to emit an exciting light;
   an optical reflector configured to receive the exciting light emitted from the semiconductor light source, and configured to reflect the exciting light toward the wavelength converting module;
   a casing having an opening attaching the semiconductor light source, the optical reflector and the wavelength converting module; and
   wherein the wavelength converting module is configured to receive the exciting light emitted from the semiconductor light source via the optical reflector, configured to wavelength-convert the exciting light into lights each having a longer light-emitting wavelength than that of the exciting, and is configured to emit a mixture light having a light-emitting direction, which mixes the lights each having the longer light-emitting wavelength than that of the exciting light, toward the opening of the casing.

17. The semiconductor light-emitting apparatus according to claim 16, further comprising:
   a projector lens having an optical axis attached to the opening of the casing, and the optical axis of the projector lens corresponding to substantially the light-emitting direction of the mixture light emitted from the wavelength converting module.

18. The semiconductor light-emitting apparatus according to claim 16, further comprising:
   an outer lens attached to the opening of the casing.

19. The semiconductor light-emitting apparatus according to claim 16, wherein the semiconductor light source includes at least one of a blue light-emitting diode emitting blue light, a ultraviolet light-emitting diode emitting ultraviolet light, a blue laser diode emitting a blue laser beam and a ultraviolet laser diode emitting ultraviolet light.

20. The semiconductor light-emitting apparatus according to claim 16, further comprising:
   a controller configured to control the semiconductor light source to emit the exciting light, and configured to control a movable micro electro mechanical systems (MEMS) mirror used as the optical reflector, wherein the movable MEMS mirror scans the exciting light toward the wavelength converting module in two dimensional directions.

* * * * *